United States Patent
Knapp et al.

(10) Patent No.: US 6,370,493 B1
(45) Date of Patent: Apr. 9, 2002

(54) SIMULATION FORMAT CREATION SYSTEM AND METHOD

(75) Inventors: Kevin L. Knapp, Fort Collins, CO (US); Kevin M. Laake, Cincinnati, OH (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/151,228

(22) Filed: Sep. 10, 1998

(51) Int. Cl.[7] .......................... G06F 9/455; G06F 17/50
(52) U.S. Cl. ............................. 703/14; 703/22; 716/5
(58) Field of Search .......................... 703/13, 14, 15, 703/16, 17, 22; 716/4, 5

(56) References Cited

U.S. PATENT DOCUMENTS

| | | | |
|---|---|---|---|
| 4,775,950 A | 10/1988 | Terada et al. | 364/578 |
| 4,982,361 A | 1/1991 | Miyaoka et al. | 364/900 |
| 5,018,089 A | 5/1991 | Kanazawa | 364/578 |
| 5,053,980 A | 10/1991 | Kanazawa | 364/578 |
| 5,062,067 A * | 10/1991 | Schaefer et al. | 703/16 |
| 5,426,768 A * | 6/1995 | Kanazawa | 703/16 |
| 5,650,947 A | 7/1997 | Okumura | 364/578 |
| 5,794,005 A * | 8/1998 | Steinman | 703/17 |
| 5,856,933 A * | 1/1999 | Maurer | 703/16 |
| 5,937,182 A * | 8/1999 | Allingham | 703/13 |

OTHER PUBLICATIONS

Miyoshi et al., "Speed Up Techniques of Logic Simulation", Proc. 22nd ACM/IEEE Conference on Design Automation, pp. 812–815, Jun. 1985.*

Rudnick et al., "Methods for Reducing Events in Sequential Circuit Fault Simulation", Digest of Technical Papers IEEE International Conf. on Computer–Aided Design, pp. 546–549, Nov. 1991.*

* cited by examiner

Primary Examiner—Russell W. Frejd (57) ABSTRACT

The present invention is a simulation test program that incorporates a formatter which asks the simulator what, if anything has changed, rather than querying for all of the pin states and strengths at each iteration, i.e. at each time stamp. If nothing has changed in the current time stamp, then the time stamp is increased until a change which has occurred in the states of the pins is detected. Then the particular change is evaluated. This drastically reduces the runtime, memory usage, and output file size of the simulations.

19 Claims, 6 Drawing Sheets

SIMULATION FORMAT CREATION SYSTEM AND METHOD

BACKGROUND OF THE INVENTION

1. Field of the Invention

This invention relates generally to the field of computers and more particularly to systems and methods of generating data for testing an integrated circuit chip.

2. Description of Related Art

Microelectronic integrated circuits (ICs), such as computer chips, are used in a variety of products including personal computers, automobiles, communication systems, and consumer electronics products. To produce an IC, a manufacturer must first design an electronic circuit to integrate (i.e., manufacture) into a chip. This stage of the design process typically requires a designer to simulate a circuit description in a circuit simulator and compare the simulated results with expected results to verify the proper operation of the circuit design. A circuit design representation, such as a circuit netlist or a Register Transfer Level (RTL) description, is input into the simulator to describe the circuit to be simulated. A netlist is typically a list of electronic logic cells with a description of the connections between the inputs and the outputs of the various logic cells. An RTL description is a description of the functionality of the circuit, much like programming source code is a description of the functionality of a software program.

To simulate the circuit, the designer must also provide input stimulus to the simulation. Input stimulus represents a set of input signals required to drive specific functional aspects of the circuit during simulation. Generally, the input stimulus used in circuit simulation is created by the designer to simulate and verify the operation of the circuit design embodied in the design representation. The input stimulus is primarily based on anticipated real world conditions (e.g., the conditions of an IC found in a cellular phone) and on requirements for properly exercising particular functional blocks within the circuit.

After a circuit is designed, it is manufactured into an IC by way of a microelectronics fabrication process. Fabrication involves multiple stages of chemical processing to create a physical IC having, for example, solid state transistors, solid state resistors, input/output pads, metal interconnections and so on. Various design, manufacturing, and operational conditions can cause a manufactured IC to perform incorrectly after it has been fabricated. Therefore, an IC manufacturer typically tests the operation of every IC it produces to verify proper operation. The testing of an IC typically requires high speed testers, typically called Automated Test Equipment (ATE) systems, that can test hundreds of chips per hour. Like circuit simulators, ATE systems also require input and output information (called "test patterns") to drive the IC and to verify results during testing.

During simulation of IC designs, significant computer runtime is generally required to ascertain strengths and logic states of signals at input, output, and bi-directional pins of an IC. Typically, the simulator or an associated program determines the signal information by querying the simulator and then outputs the resulting logic states to an output file, an output data structure, or database. Conventional algorithms analyze the states of all pins at each iteration. Generally, the more input, output, and bi-directional pins in the IC design, the longer the runtime. The problem with conventional algorithms employed to perform this task lies in excessive looping through each signal in an IC design, which increases the runtime of the simulation. Because the modern trend in ICs involves rapidly increasing pin counts, the impact of the conventional algorithm's inefficiency is becoming too costly to ignore. Therefore, there is a need for a simpler and more time efficient method for ascertaining the strengths and logic states of input and output signals in an IC in order to reduce the overall runtime of simulation programs.

SUMMARY OF THE INVENTION

The primary object of the invention is to provide a formatting program for a simulation program that includes a method of pin testing that reduces the runtime, memory usage and output file size of tests performed on IC designs under simulation.

The present invention is preferably embodied by a software program that asks a simulator which pin strengths in a design, if any, have changed rather than analyzing the signal strengths and logic states for each pin in the design at each iteration, i.e., at each simulation time stamp. If no pin strength changes since the previous time stamp, the event is ignored and the time stamp is increased until a pin strength change is detected. After such a pin strength change is detected, the input, output, or bi-directional signal can then be processed and output for use by another design or test tool This technique drastically reduces the runtime, memory usage, and output file size of a simulation.

A program in accordance with the present invention is linkable with conventional simulator programs. It provides a quick and accurate method of reporting the logic states of input, output, and bi-directional pins for verification of design accuracy. The program can be called in the testbench of the simulation. A test bench is a set of instructions that configure and initiate a simulation.

A program in accordance with the present invention produces a print on change file that stores logic values associated with pins of a circuit design in accordance with specified time stamps. A program in accordance with the present invention asks the simulator which pin strengths in a design, if any, have changed. If a pin strength change has occurred, then the program retrieves a corresponding number that identifies a pin with a changed pin strength. Using the retrieved number, the program then asks the simulator for strength contributions of the pin's signal and maps the strengths to an appropriate logic state. The resulting logic state and the corresponding pin are printed in an output file according to the time stamp in which the change was detected.

The method in accordance with the present invention ignores a pin until it changes, which reduces the computer runtime by avoiding unnecessary testing of the strength of every pin in the design at each time stamp. The program method of the invention is only concerned with changes of state and strength. The method queries the simulator to return just the pins that have changed strengths. The method then retrieves the strength contributions ("strength1" and "strength0") for the returned pins and maps these strength contributions to a logic state that is output to an output file.

Other objects, features and advantages of the present invention will become apparent from a reading of the following detailed description when taken in conjunction with the accompanying drawing wherein a particular embodiment of the invention is disclosed as an illustrative example.

DETAILED DESCRIPTION OF THE INVENTION

Figure 1:
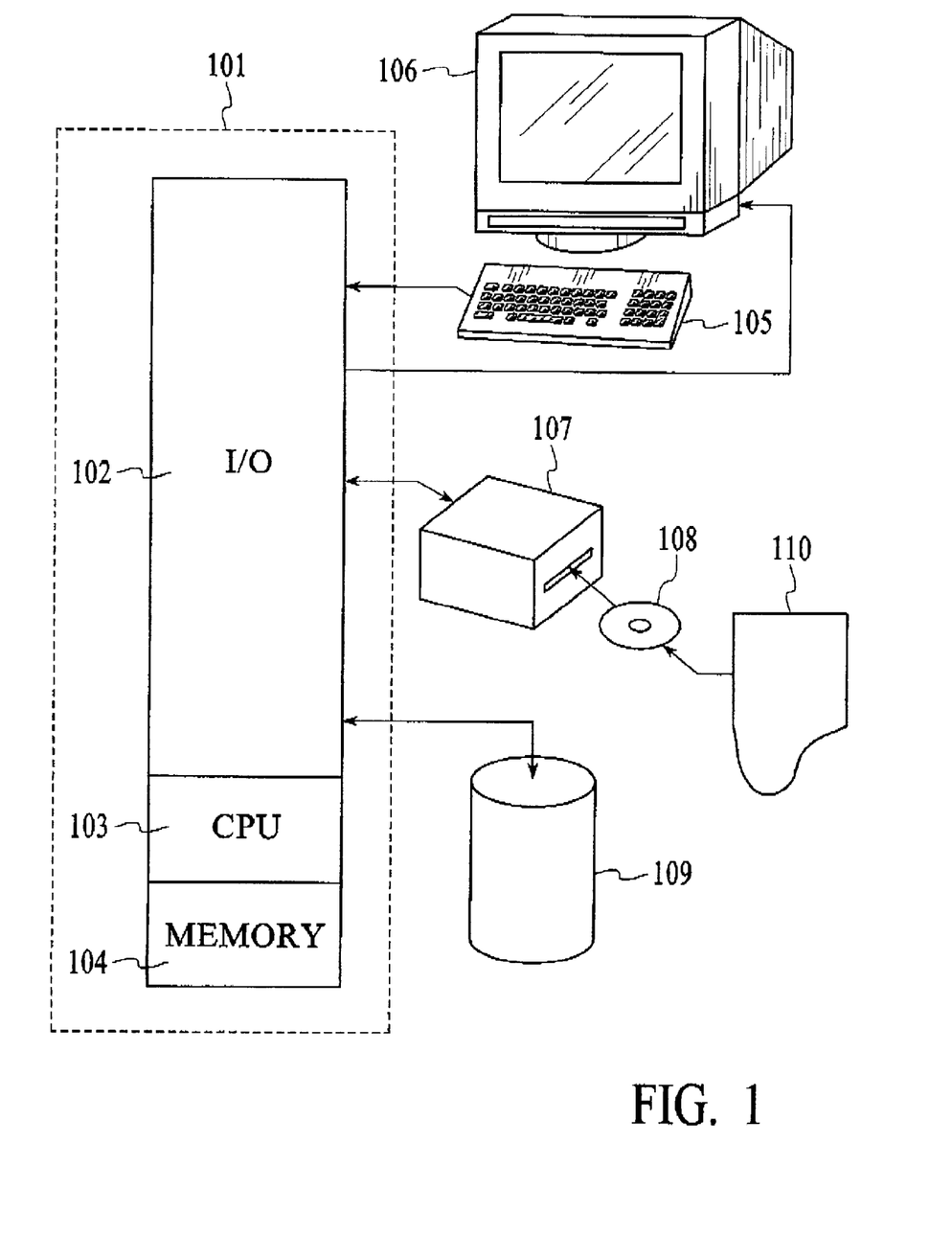
FIG. 1 depicts a general purpose computer in accordance with the present invention.

One operating environment in which the present invention is potentially useful encompasses the general purpose computer. In such a system, data and program files may be input to the computer, which reads the files and executes the programs therein. Some of the elements of a general purpose computer are shown in FIG. 1, wherein a processor 101 is shown having an input/output (I/O) section 102, a Central Processing Unit (CPU) 103, and a memory section 104. The present invention is optionally implemented in software devices loaded in memory 104 and/or stored on a configured CD-ROM 108 or storage unit 109 thereby transforming the computer system in FIG. 1 to a special purpose machine for implementing the present invention.

The I/O section 102 is connected to keyboard 105, display unit 106, disk storage unit 109, and disk drive unit 107. Generally, in contemporary systems, the disk drive unit 107 is a CD-ROM driver unit capable of reading a CD-ROM medium 108, which typically contains programs 110 and data. Computer program products or circuit models containing mechanisms to effectuate the apparatus and methods in accordance with the present invention may reside in the memory section 104, on a disk storage unit 109, or on the CD-ROM medium 108 of such a system. Alternatively, disk drive unit 107 may be replaced by a floppy drive unit, a tape drive unit, or other storage medium drive unit. Examples of such systems include SPARC systems offered by Sun Microsystems, Inc., personal computers offered by IBM Corporation and by other manufacturers of IBM-compatible personal computers, and other systems running a UNIX-based or other operating system. In accordance with the present invention, simulator, verification, translation, and generation modules may be executed by CPU 103, and simulation output, input stimulus, and other data may be stored on disk storage unit 109, disk drive unit 107 or other storage medium drive units coupled to the system.

Figure 2:
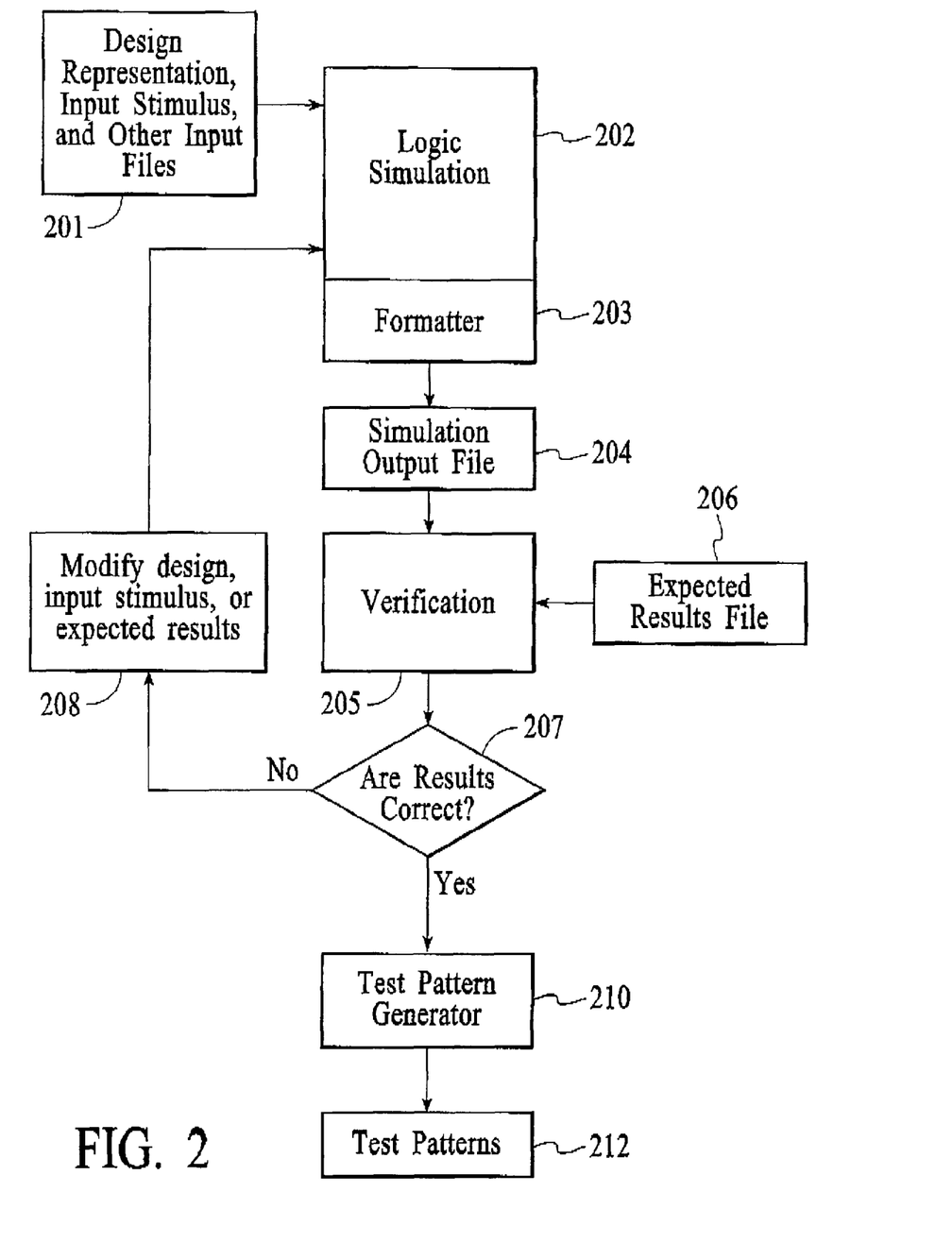
FIG. 2 depicts an overall block flow diagram for a design flowing having a simulator and a formatter in accordance with the present invention..

FIG. 2 illustrates generally a test pattern generation process 200 incorporating the formatting in accordance with the present invention. In general, circuit design representation 201, preferably in RTL, netlist, or design database format, is simulated in a logic simulation module 202 and formatted in a formatter 203 to produce a simulation output file 204. For example, a VERILOG simulator requires that the input stimulus be in a proprietary format specified, for example, in Cadence VERILOG-XL IC 4.42 Simulation Reference Manual, specifically incorporated herein by reference for all that it discloses and teaches. Other input stimulus formats, such as VHSIC Hardware Description Language (VHDL) and Verilog Hardware Description Language, are also contemplated within the scope of the present invention.

The simulation output file 204 is a "print-on-change" file that includes the timing, state, and strength of input, output, and bi-directional signals operating during the simulation. Input, output, and bi-directional signal descriptions include a time stamp value, indicating the time of a signal change during the simulation and a logic state value for signals in the simulation. The state of a signal, for example, can include a "strong low" ("0"—indicating a logical 0), a "strong high" ("1"—indicating a logical 1), a "resistive low" ("O"—indicating a low resistive voltage), a "resistive high" ("I"—indicating a high resistive voltage), a "strong X" ("X"—indicating an unknown state), or a high-impedance state ("*"—indicating a tri-stated signal state), although other state values or symbols are also contemplated as being within the scope of this invention.

In an exemplary embodiment of the present invention, the logic states for all pins are printed out whenever one pin changes, even though only the pins that have changed are actually analyzed. In an alternate embodiment, signal information is printed out only for those pins that have changed. Furthermore, other simulation output file formats are contemplated within the scope of the present invention, which will be readily apparent to those skilled in the art.

Table 1 shows an example of simulation output file data. Assume that a design has three input signals, I1, I2, and I3, and three output signals, O1, O2 and O3. In a table in the header of each simulation output file, each signal is associated with a column number in the simulation output file (i.e., I1 is associated with column 1, I2 is associated with column 2, etc.). After the header, as shown in Table 1, the states and strengths of each signal at various times during the simulation are listed until the simulation is completed. The first row in the table shows the initial logic states of the signals. The second row shows that the I1, I2, and I3 signals changed states from X's to a 0's, O1 changed from an X to an * state, and O3 changed from an X to a 1 at 100 ns into the simulation. The third row shows that the I2 signal changed from a 0 to a 1 and the O2 signal changed from an X to a 1 at 100.000017 ns into the simulation. The fourth row shows that the O3 signal changed states from a 1 to a 0 at 100.000067 ns into the simulation. The times associated with each row are based on the time of a logic state change and are not dependent on a tester or simulator cycle. The data format illustrated in Table 1 is an example of data used in one embodiment in accordance with the present invention.

TABLE 1

AN EXAMPLE OF AN SIMULATION OUTPUT DATA FORMAT

| Time | I1 | I2 | I3 | O1 | O2 | O3 |
|---|---|---|---|---|---|---|
| 000.000000 ns | X | X | X | X | X | X |
| 100.000000 ns | 0 | 0 | 0 | * | X | 1 |
| 100.000017 ns | 0 | 1 | 0 | * | 1 | 1 |
| 100.000067 ns | 0 | 1 | 0 | * | 1 | 0 |

Table 2 depicts an alternate format of simulation output data file, wherein, after the initial time stamp, only the logic states for pins that have changed are stored in the simulation output file.

TABLE 2

AN ALTERNATE EXAMPLE OF AN SIMULATION OUTPUT DATA FORMAT

P timestep "1e-12"
T 0.00
D I1 0 X
D I2 1 X
D I3 2 X
D O1 3 X
D O2 4 X
D O3 5 X
T 100000.000

TABLE 2-continued

AN ALTERNATE EXAMPLE OF AN SIMULATION OUTPUT
DATA FORMAT

S 0 0
S 1 0
S 2 0
S 3 *
S 5 1
T 100000.017
S 1 1
S 4 1
T 100000.067
S 5 0

In the file of Table 2, "P" indicates the units of the time stamp values, which in this case is picoseconds. "T" represents a time stamp value. The "D" lines that follow the 0.00 time stamp define a pin instance (or signal) name in the second field. The pin instance name may be hierarchical (i.e., a pathname into the design). The third field defines an index number for the pin instance, and the fourth field defines the initial logic state of the defined signal. In the example of Table 2, all signals are initially "X" (unknown). For example, signal "I1" is given the index "0" and signal "O2" is given the index "4". This index is used in the "S" lines, which define the changed logic state of the signal.

Verification module 205 compares the simulation results to the contents of an expected results file 206 to determine whether the design simulates as expected, as compared with a set of expected results provided by the designer from an Expected Output file 206. If, as determined in decision block 207, the results are not correct, the designer modifies the design, the input stimulus, and/or the expected results in block 208 and re-simulates the design with the modifications. This process is repeated iteratively until the simulation results satisfy the expected results (provided by the designer), at which point the process proceeds to a test pattern generator module 210, which produces a series of test patterns 212 for use in testing the operation of the designed chip.

Verification module 205 also ensures that the input, output, and bi-directional signal waveform formats are compatible with the targeted ATE system. Each ATE system supports a specific set of waveform formats. Examples of such formats might include Return to Zero (RZ), Return to One (RO), Non-Return to Zero (NRZ), Non-Return to One (NRO), and Surround by Complement (SBC). These waveform formats are known in the art of ATE technology and are further described in Chapter 1 of Reference Manual for Symbios Logic Design Packages—Design Test Release 2.5, specifically incorporated herein by reference for all that it discloses and teaches.

The present invention may be specifically incorporated into the formatter 203 described briefly above. A detailed logic block flow diagram of the formatter operational program 203 in the simulation process 200 in accordance with the present invention is shown in FIGS. 3A, 3B, 3C and 3D. The process of operations or instructions starts in block 300. As described above, the design representation, input stimulus, and other input files are inputted into the simulator in operation 302 and the logic simulation program begins in operation 304. The method illustrated in FIG. 3 results in a simulation output file format like that shown in Table 2.

Figure 3A:
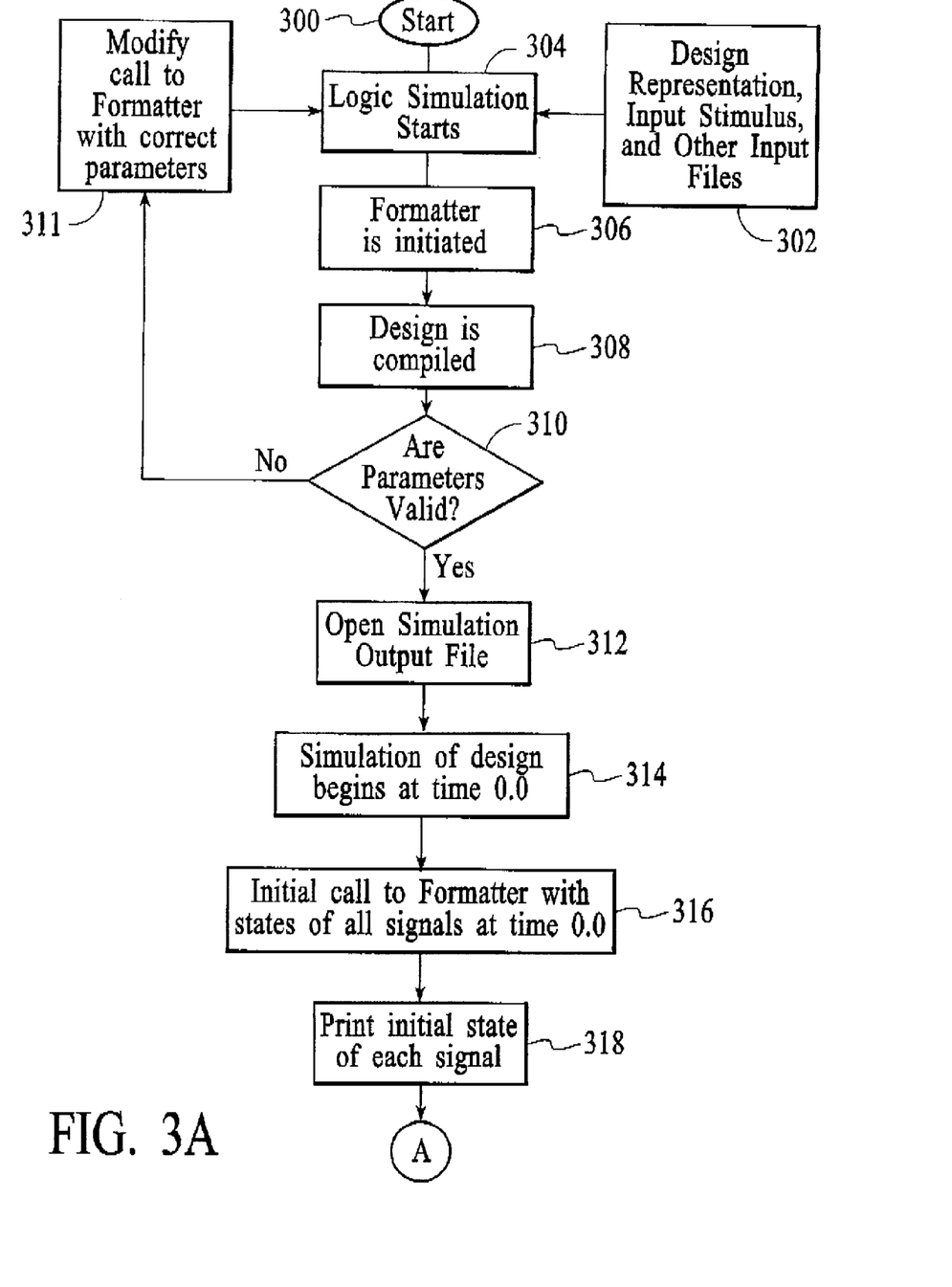
FIGS. 3A, 3B, 3C and 3D together depict a block diagram of the process operational blocks of the formatter program in accordance with the present invention.

The simulation program triggers initialization of the formatter routine in operation 306 and then compiles the design in operation 308. In an exemplary embodiment, the communication between the simulation program and the formatter routine is accomplished by way of Cadence's Programming Language Interface (PLI), specified in "Programming Language Interface—Reference Manual, Version 1.6a, by Cadence Design Systems, Inc., specifically incorporated herein by reference for all that it discloses and teaches. A testbench configures the simulator to "trigger" a routine in the formatter when particular events occur within the simulator. For example, a formatter in accordance with the present invention may be set up to be triggered whenever a pin strength value changes from a previous strength value. Other trigger events may also be set, including an event based on a predetermined time or another device parameter condition within the circuit. The formatter can evaluate the cause of the event (i.e., whether the event is a signal strength change event or some other event), to determine whether to perform the formatting function. When the formatter performs the proper response to the trigger event, the formatter can return control to the simulator and await the next trigger event.

Once the design is compiled, the program asks, in operation 310, whether all of the specified parameters are valid parameters for the formatter. If the parameters are valid, then control transfers to operation 312 where the simulation output data file is opened to receive formatter output data. If invalid input parameters are received, control shifts to operation 314 where the call to the formatter 203 is modified with correct parameters supplied by the user or other portions of the simulation program, which are not relevant to the present invention. Control then returns to operation 304 and operations 304, 306, 308, and 310 are repeated until all parameters are validated.

In operation 312, the simulation output file is opened and design simulation begins at time stamp 0.0 in operation 314. Control then shifts to operation 316 where the logic states of all formatter signals are initialized at the time stamp 0.0, where a logic state is a device parameter. In operation 318, the initial states of each signal are recorded to the simulation output file as a beginning or baseline point of reference. In operation 320, all of the Parameter Value Change (PVC) flags are reset. Each PVC flag corresponds to a pin on the IC, and a reset flag indicates that the corresponding pin is to be monitored for a signal strength change, where signal strength is also a device parameter. Other device parameters, such as power consumption, may also be monitored in accordance with the present invention. The simulator puts a pin's PVC flag in a "set" state if the strength of the pin changes during the simulation. The simulator uses this mechanism to keep track of which pins have changed during a simulation period. Control then returns to the simulation program until an event occurs in the simulation program that requires output to the simulation output file. At this point in the simulation, the formatter program is set to process the simulated circuit results as they are generated.

In accordance with the present invention, it is possible to selectively reset PVC flags so that triggering events occur only when there is a strength change on selected pins. For example, if simulation output data is required only for pins coupled to a certain circuit ("target pins") within the design, the formatter can reset the PVC flags corresponding to only those pins. Accordingly, the triggering event would occur only when a strength on one of those target pins changes. Furthermore, as the formatter iteratively processes each changed pin, identifiers for non-target pins would not be returned by the simulator. This technique allows a user to further focus the processing of simulation results, improving overall simulation performance.

Figure 3B:
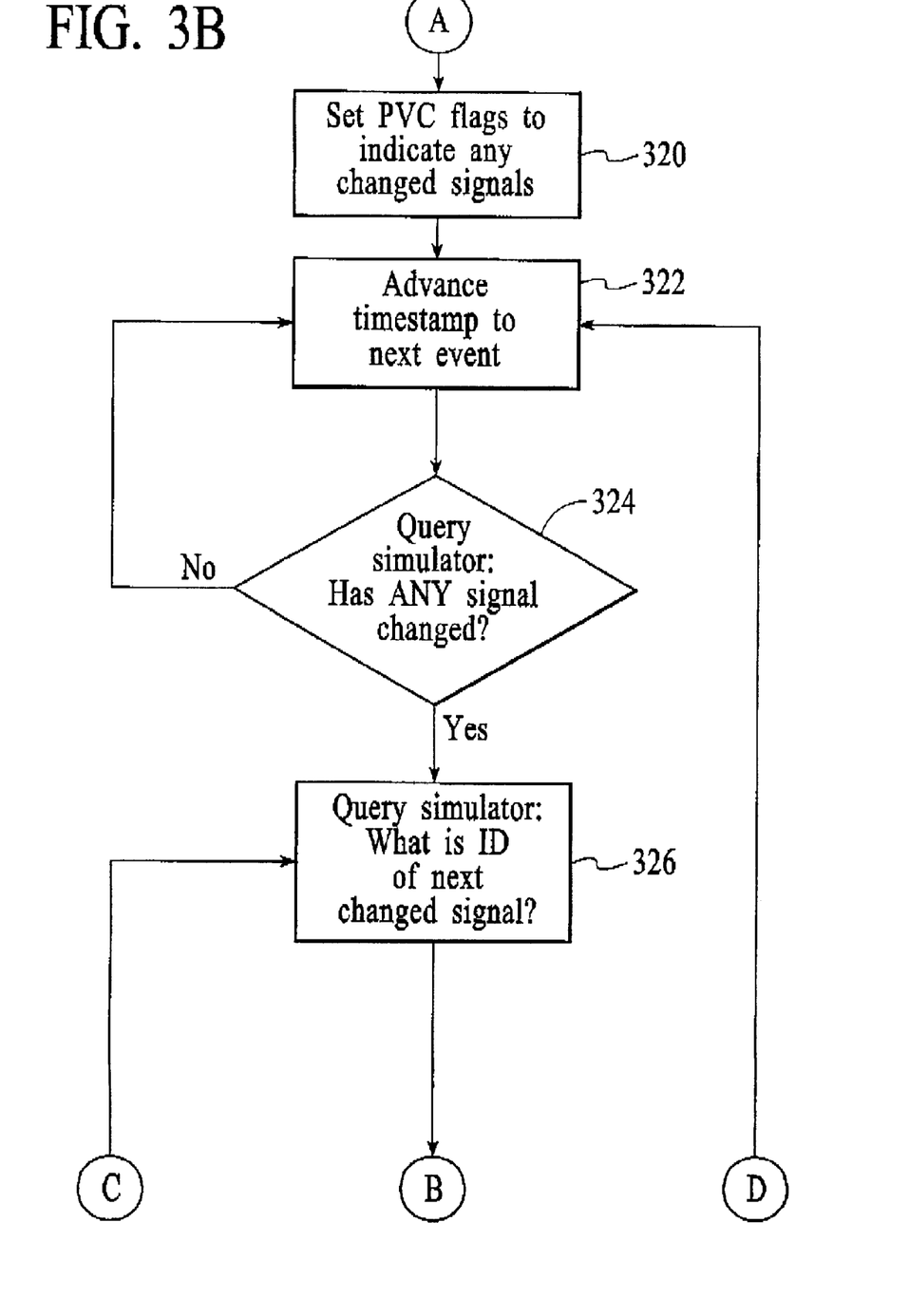

When the next triggering event occurs, the formatter 203 is triggered by the simulation program and control transfers to operation 322 where the formatter time stamp is advanced to the time of the event. Control then transfers to operation 324 where the formatter queries the simulator 202 whether any signals have changed (e.g., whether any PVC flags are set indicating a signal has changed). If no signal has changed, control reverts to the simulator. The formatter 203 awaits the next event triggered by the simulator 202 at which point the time stamp is advanced in operation 322 and the simulator 202 is again queried in operation 324 whether there has been any signal strength change (e.g., a PVC flag has been set).

If one or more of the signals have changed (and thus at least one PVC flag set), then control transfers to operation 326 in which the simulator is queried to identify the changed pin with an ID parameter. Control then transfers via "B" shown in FIGS. 3B and 3C to operation 328. In operation 328, the simulator is queried for the new strength value of the changed signal. This strength value is then mapped to a logic state in accordance with the states as indicated in Table 3 below.

TABLE 3

STRENGTH CHANGE LOGIC MAPPING

|  | Strength0 | | | |
|---|---|---|---|---|
| Strength1 | Hi Z | V Weak | weak | Strong |
| Hi Z | * | O | O | 0 |
| V Weak | I | U | U | 0 |
| Weak | I | U | U | 0 |
| Strong | 1 | 1 | 1 | X | where:
*=High Impedance
U=Resistive Unknown
I=Resistive High
O=Resistive Low
X=Unknown
1=High
0=Low The simulator returns two strengths, or "bias voltage contribution" values, strength0 and strength1 Each strength represents a simulated bias strength (i.e., "Hi Z" representing a high impedance, "V Weak" representing a very weak voltage, "Weak" representing a weak voltage, "Strong" representing a strong voltage) applied to the input, output, or bidirectional pins of a simulated circuit. Strength0 represents a pull-down bias voltage, tending to a logic 0. Strength1 represents a pull-up bias voltage, tending to a logic 1. The combined effect of these two bias strengths constitutes one of the several possible logic states produced in the simulation output file.

Once the strength value has been mapped into the logic state in operation 330, the time stamp, signal identifier, and logic state are printed to the output file in operation 332. The program then transfers to operation 334 where the simulator is queried whether there are any more changed signals in the time stamp. If there are additional changed pins, then control transfers or loops back through "C" in FIGS. 3C and 3B to operation 326 where the ID of the next changed signal is determined, etc. Note that unchanged pins are not evaluated, thereby improving efficiency. This iterative process through operations 326, 328, 330, 332, and 334 repeats until all of the changed pins have been evaluated. When no more changed pins are left, control transfers to operation 336 in which all of the PVC flags are reset for all pins or for the subset of target pins in preparation for advancing to the next triggering event and time stamp.

Figure 3C:
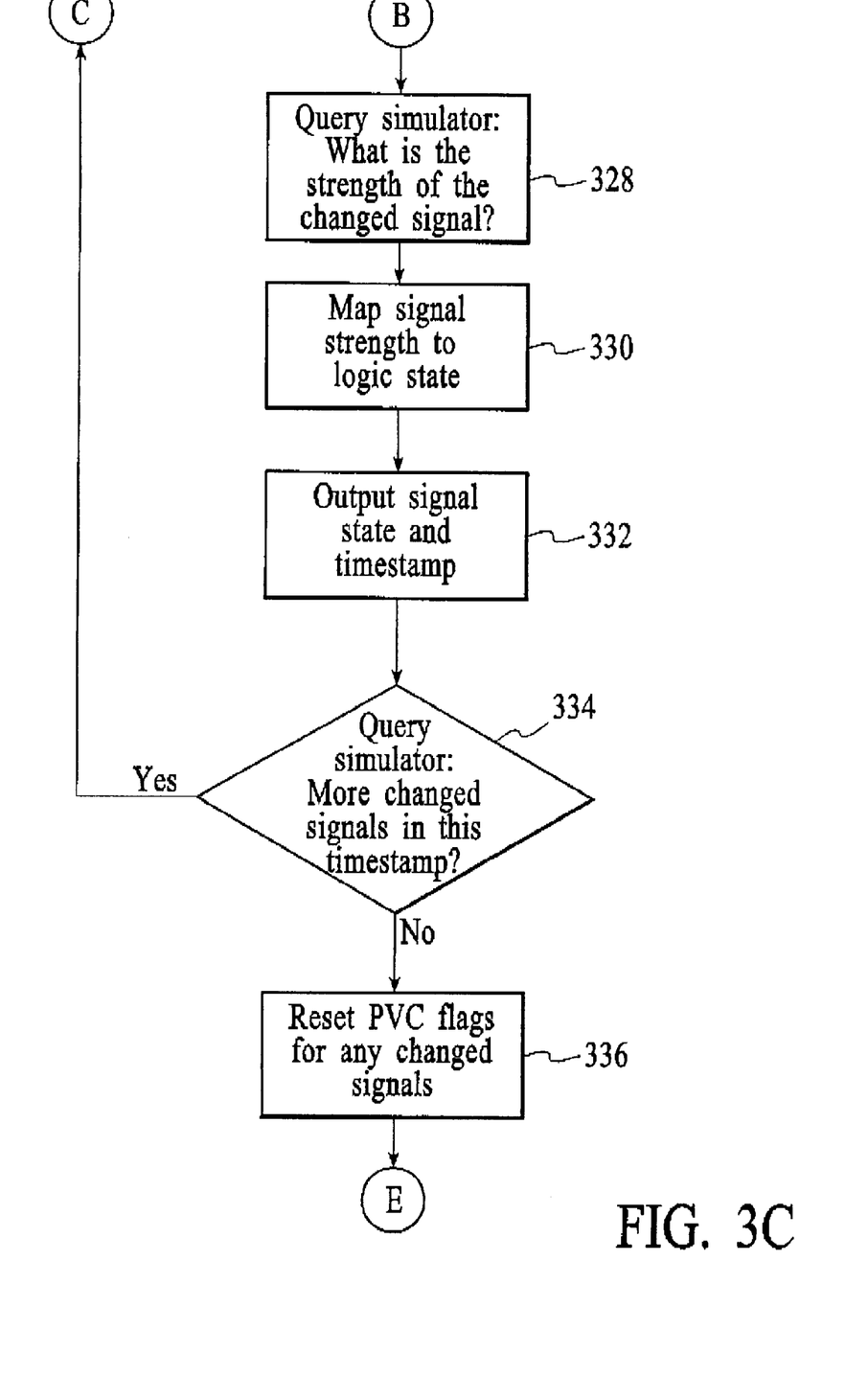
Figure 3D:
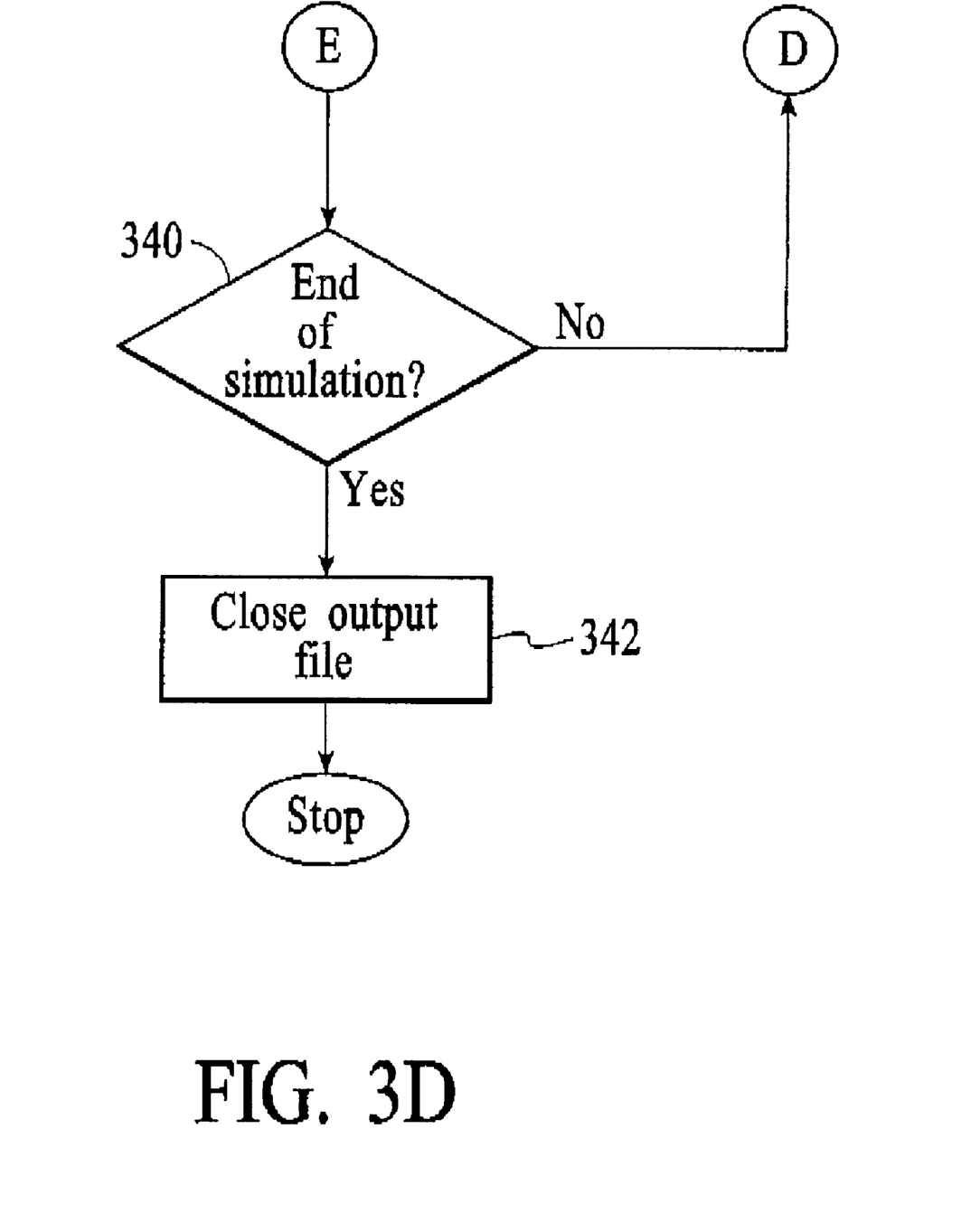

Control then transfers via "E" in FIG. 3C to "E" in FIG. 3D to operation 340 to ascertain, in operation 340, whether the simulation is complete. If not, control transfers via "d" back to operation 322 in FIG. 3B where the formatter awaits the next event call from the simulation 202. When the next event is received, operations 324, 326, 328, 330, 332, 334, and 336 repeat as described above. When the simulation is complete, the simulation output file is closed in operation 342 and formatter operation is complete. The control passes to the verification operation 205 shown in FIG. 2.

One particular embodiment of the present invention prints all of the signals to the output file in operation 332 (see Table 1). Thus the output file comprises the logic state of every pin at each time stamp. In an exemplary embodiment producing the type of simulation output file shown in Table 1, the logic state of every pin is saved in an array having an array element allocated for each pin. When the logic states of each pin are determined at time stamp 0.0, they are loaded into an array having an element for each pin or target pin in the IC. At time stamp 0.0, the contents are then written to the simulation output file. For each subsequent timestep, rather than printing out each changed pin's logic state after the state is determined, the resulting state is loaded into the array element corresponding to the pin or target pin in the IC. When all changed pins are evaluated and their new states loaded into the array, the formatter prints out the contents of the array, including both changed and unchanged pins, to the simulation output file.

Alternately, another embodiment has the operation 332 (see Table 2) printing only the changed signal ID and its logic value to the output file. This latter embodiment is preferred as it is more time efficient to only print the values that have changed, since the prior values are recorded at the previous time stamp for which there was either no change or a change in the parameter value.

The present invention may be practiced otherwise than as specifically described above. Many changes, alternatives, variations, and equivalents to the various structures shown and described will be apparent to one skilled in the art. For example, triggering events and formatter processing can respond to changes in strength of at least one pin of the simulated IC. Such strength changes may not map to changes in logic state (e.g., if strength0 initially equals "Strong", strength1 initially equals "Weak", such that the logic state equals "0", and then strength1 changes to "Hi Z", the logic state remains a "0"). A formatter in accordance with the present invention may test the new logic states of changed pins (i.e., pins with a changed strength) to determine whether the logic states changed as well. If not, the format may choose to forego outputting the unchanged state to the simulation output file.

Accordingly, the present invention is not intended to be limited to the particular embodiments illustrated but is intended to cover all such alternatives, modifications, and equivalents as may be included within the spirit and broad scope of the invention as defined by the following claims. All patents, patent applications, and printed publications referred to herein are hereby incorporated by reference in their entirety.

What is claimed is:

1. A program storage medium, readable by a computer, tangibly embodying a program of instructions executable by said computer for generating simulation output data from a simulation of a circuit, said simulation being performed by a simulator, said simulated circuit having a plurality of signal pins, each signal pin having a first value for a device parameter at a first time, the program comprising instructions for:

selecting a set of said plurality of pins to be monitored;

identifying at least one of said selected set of pins having a second value for said device parameter at a second time, said second value being unequal to said first value; and outputting simulation output data relating to said second value for said at least one of said identified pins, thereby reducing runtime, memory usage, and output file size of said simulation.

2. The program storage medium of claim 1 wherein the instructions for selecting comprise instructions for identifying said selected set of pins using an array of flags, each flag being associated with a pin of said selected set of pins.

3. The program storage medium of claim 1 wherein the instructions for identifying at least one of said selected set of pins having a second value of said device parameter at a second time comprise instructions for receiving an event from said simulator when any pin of said selected set of pins has said second value unequal to said first value of said pin.

4. The program storage medium of claim 1 wherein the instructions for identifying at least one of said selected set of pins having a second parameter at a second time comprise instructions for querying said simulator to return an identifier of said at least one of said selected set of pins having a second value unequal to said first value of said pin.

5. The program storage medium of claim 1 wherein said device parameter is signal strength and wherein the instructions for outputting simulation output data relating to said second value for at least one of said identified pins comprises instructions for:

querying said simulator for a strength value of said at least one of said identified pins at said second time, said strength value comprised of a first contribution value and a second contribution value;

mapping said strength value to a first logic state for said at least one of said identified pins; and outputting said first logic state as a portion of said simulation output data.

6. The program storage medium of claim 5 wherein said instructions for outputting said first logic state comprise instructions for:

storing a second logic state for one of said identified pins based on said first time; and outputting said first logic state as a portion of said simulation output data, if, responsive to said mapping instructions, said first logic state is unequal to said second logic state.

7. The program storage medium of claim 5 wherein said instructions for outputting said first logic state comprise instructions for:

providing an array having a memory element corresponding to each pin of said selected set of said plurality of pins;

storing in said array a second logic state for each pin of said selected set based on said first time;

storing said first logic state of at least one of said identified pins at said second time in said memory element corresponding to said at least one identified pin, if, responsive to said mapping instructions, said first logic state is unequal to said second logic state; and outputting said stored logic state from said memory array for each of said identified pins.

8. A method for generating simulation output data from a simulation of a circuit, said simulation being performed by a simulator, said simulated circuit having a plurality of signal pins, each signal pin having a first value for a device parameter at a first time, said method comprising the steps of:

selecting a set of said plurality of pins to be monitored;

identifying at least one of said selected set of pins having a second value for said device parameter at a second time, said second value being unequal to said first value; and outputting simulation output data relating to said second value for said at least one of said identified pins, thereby reducing runtime, memory usage, and output file size of said simulation.

9. The method of claim 8 wherein the step for selecting comprises the step of identifying said selected set of pins using an array of flags, each flag being associated with a pin of said selected set of pins.

10. A program storage medium, readable by a computer, tangibly embodying a program of instructions executable by said computer for generating simulation output data from a simulation of a circuit, said simulation being performed by a simulator, said simulated circuit having a plurality of signal pins, each signal pin having a first logic state and a first value pair for a strength parameter at a first time, the program comprising instructions for:

selecting a set of said plurality of pins to be monitored;

identifying at least one of said selected set of pins having a second value pair for said strength parameter at a second time, said second value pair being unequal to said first value pair;

mapping said second value pair for said strength parameter to a second logic state; and outputting from said simulation said second logic state for said at least one of said identified pins, thereby reducing runtime, memory usage, and output file size of said simulation.

11. The program storage medium of claim 10 wherein the instructions for selecting comprise instructions for identifying said selected set of pins using an array of flags, each flag being associated with a pin of said selected set of pins.

12. The program storage medium of claim 10 wherein the instructions for identifying at least one of said selected set of pins having a second value pair of said strength parameter at a second time comprise instructions for receiving an event from said simulator when any pin of said selected set of pins has said second value pair unequal to said first value pair of said pin.

13. The program storage medium of claim 10 wherein said instructions for outputting said second logic state for said at least one of said identified pins comprise instructions for outputting said second logic state for said at least one of said identified pin only if said second logic state is unequal to said first logic state.

14. A formatting method for use with a circuit simulation program in which a plurality of pins in a circuit design are systematically tested, said formatting method comprising the steps of:

a) initializing content of an output file with a first logic state for each of said pins at a first time stamp;

b) resetting a parameter value change flag corresponding to each of said pins signals;

c) receiving an event from said simulation program at a second time stamp;

d) determining if any of said parameter value change flags have changed at said second time stamp;

e) ascertaining a signal identification value and logic state value for each signal corresponding to each of said changed parameter value change flags;

f) printing said values for said signals corresponding to each of said changed parameter value change flags to said output file, thereby reducing runtime, memory usage, and output file size of said simulation; and g) advancing to a next timestep upon receipt of a next event from said simulation program.

15. The method according to claim 14 of further comprising the step of mapping a strength value to said logic state value in accordance with predetermined criteria.

16. The method according to claim 14 wherein each of said signal identification values and logic state values are outputted to said output file at each time stamp.

17. An circuit design simulator having a logic simulation program for determining logic states for pins in a circuit design being simulated and a formatter coupled to said simulation program for formatting output of said simulation program, said formatter comprising the steps of:

initializing a parameter value change flag for each pin of said circuit design being simulated in said logic simulation program;

opening a simulation output file for receiving data from said formatter; beginning a logic simulation of said circuit design at an initial time;

outputting to said output file one of said logic states of each pin at said initial time;

receiving an event at a next time;

ascertaining from said simulation program whether any parameter value change flags have changed;

for only parameter value change flags that have changed, ascertaining a pin ID and strength value for each pin corresponding to each changed parameter value change flag; mapping said strength value to a logic state;

outputting said pin ID and said logic state for each changed parameter value change flag to said simulation output file;

returning control to said simulator; awaiting a next event at a third time; and repeating said ascertaining, mapping, outputting, returning and awaiting steps for each next event until said simulation program is complete, thereby reducing runtime, memory usage, and output file size of said simulation.

18. The method according to claim 17 wherein said outputting step comprises printing a logic state for every pin in said circuit design to said simulation output file at each time for which there is a parameter value change flag set.

19. The method according to claim 17 wherein said outputting step comprises printing to said simulation output file only pin IDs and associated logic states corresponding to set parameter value change flags.

* * * * *